US007163876B2

(12) United States Patent
Nagai et al.

(10) Patent No.: US 7,163,876 B2
(45) Date of Patent: Jan. 16, 2007

(54) METHOD FOR MANUFACTURING GROUP-III NITRIDE COMPOUND SEMICONDUCTOR, AND GROUP-III NITRIDE COMPOUND SEMICONDUCTOR DEVICE

(75) Inventors: Seiji Nagai, Aichi (JP); Masayoshi Koike, Aichi (JP); Kazuyoshi Tomita, Aichi (JP)

(73) Assignees: Toyoda Gosei Co., Ltd, Aichi-ken (JP); Kabushiki Kaisha Toyota Chuo Kenkyusho, Aichi-ken (JP)

( * ) Notice: Subject to any disclaimer, the term of this patent is extended or adjusted under 35 U.S.C. 154(b) by 95 days.

(21) Appl. No.: 10/473,075

(22) PCT Filed: Mar. 12, 2002

(86) PCT No.: PCT/JP02/02318

§ 371 (c)(1),
(2), (4) Date: Jan. 8, 2004

(87) PCT Pub. No.: WO02/080242

PCT Pub. Date: Oct. 10, 2002

(65) Prior Publication Data

US 2004/0219702 A1 Nov. 4, 2004

(30) Foreign Application Priority Data

Mar. 29, 2001 (JP) ............................ 2001-097228
Mar. 30, 2001 (JP) ............................ 2001-098065

(51) Int. Cl.
*H01L 21/36* (2006.01)

(52) U.S. Cl. .......................... 438/478; 438/22; 438/42; 438/44; 438/481

(58) Field of Classification Search ................ 438/478, 438/22, 44, 46, 481, 604, 607
See application file for complete search history.

(56) References Cited

U.S. PATENT DOCUMENTS 6,342,404 B1 * 1/2002 Shibata et al. ................ 438/46

FOREIGN PATENT DOCUMENTS

| | | |
|---|---|---|
| JP | 5-251738 | 9/1993 |
| JP | 5-291156 | 11/1993 |
| JP | 7-122520 | 5/1995 |
| JP | 7-273367 | 10/1995 |
| JP | 8-51252 | 2/1996 |
| JP | 11-251253 | 9/1999 |
| JP | 2000-021789 | 1/2000 |
| JP | 2000-286450 | 10/2000 |

* cited by examiner

*Primary Examiner*—Thanh Nguyen
(74) *Attorney, Agent, or Firm*—McGinn IP Law Group, PLLC

(57) ABSTRACT

In the epitaxial growth process in which each growth region D is zoned by a mask 2 formed in grid pattern, because a consumption region C of the Group III nitride compound semiconductor is formed in the central portion of each band of the mask 2 between each adjacent edge portion of the growth region D, Group III or Group V raw material is never unnecessarily supplied to the edge portion of the growth region D. As a result, difference of Group III or Group V rare material supply amount to the edge portion and central portion of the device formation region D is suppressed and the edge portion of the device region may not be convexity.

17 Claims, 11 Drawing Sheets

METHOD FOR MANUFACTURING GROUP-III NITRIDE COMPOUND SEMICONDUCTOR, AND GROUP-III NITRIDE COMPOUND SEMICONDUCTOR DEVICE

TECHNICAL FIELD

The present invention relates to a method for fabricating Group III nitride compound semiconductors.

The Group III nitride compound semiconductors are generally represented by $Al_xGa_yIn_{1-x-y}N$ (wherein $0 \leqq x \leqq 1$, $0 \leqq y \leqq 1$, and $0 \leqq x+y \leqq 1$), and examples thereof include binary semiconductors such as AlN, GaN, and InN; ternary semiconductors such as $Al_xGa_{1-x}N$, $Al_xIn_{1-x}N$, and $Ga_xIn_{1-x}N$ (wherein $0<x<1$); and quaternary semiconductors such as $Al_xGa_yIn_{1-x-y}N$ (wherein $0<x<1$, $0<y<1$, and $0<x+y<1$). In the present specification, unless otherwise specified, "Group III nitride compound semiconductors" encompass Group III nitride compound semiconductors which are doped with an impurity so as to make p-type or n-type conductivity.

BACKGROUND ART

Group III nitride compound semiconductors are direct-transition type semiconductors exhibiting a wide range of emission spectra from UV to red light when used in a device such as a light-emitting device, and have been used in light-emitting devices such as light-emitting diodes (LEDs) and laser diodes (LDs). In addition, due to their broad band gaps, devices employing the aforementioned semiconductors are expected to exhibit reliable operational characteristics at high temperature as compared with those employing semiconductors of other types, and thus application thereof to transistors such as FETs has been energetically studied. Moreover, since Group III nitride compound semiconductors contain no arsenic (As) as a predominant element, application of Group III nitride compound semiconductors to various semiconductor devices has been longed for from the environmental aspect. Generally, these Group III nitride compound semiconductors are formed on a sapphire substrate and also a silicon (Si) substrate.

When a group III nitride compound semiconductor is formed on a silicon (Si) substrate, epitaxial growth process may be carried out under condition that stress owing to misfit of lattice constants between the silicon (Si) substrate and the group III nitride compound semiconductor is always applied. Difference of thermal expansion coefficients between the silicon (Si) substrate and the group III nitride compound semiconductor increases the stress in a cooling process, to thereby generate a lot of cracks (fractures) in the group III nitride compound semiconductor layer. As a result, cracks (fractures) generated in a region where a light-emitting device or other device is formed make the device a defective product and because of that yield rate of the device becomes remarkably poor.

For example, there is a conventional art to zone each growth region as a device forming region (1 $mm^2$ or less) and to form a mask in a pane form at the region besides the growth region. This conventional art enables to suppress generation of cracks (fractures) smaller and confine cracks therein because the individual region can be smaller even when cracks are generated in the device region and stress is not propagated from the adjacent regions form the individual region.

By zoning each device forming region, however, crystal ordinarily grows faster at the edge portion of the region, and that results in forming the region whose central portion is concaved in epitaxial growth. FIG. 11 illustrates such a region. As shown in FIG. 11, a substrate 91, a mask material 92 and a group III nitride compound semiconductor layer 93 are disclosed. Here the group III nitride compound semiconductor layer 93 may not always have a single layer structure. The group III nitride compound semiconductor layer 93 becomes as illustrated in FIG. 11 because the supply amount of group III and group V material is different at the edge portion E and at the central portion M of the device formation region D: the supply amount of group III and group V material is larger at the edge portion E.

Also, when such a selected growth process is carried out so as not to generate cracks, actually stress cannot be relaxed sufficiently and especially threading dislocations do not decrease. In short, generation of cracks (fractures) means relaxation of stress owing to the cracks (fractures). So when the cracks are suppressed, stress is always applied to threading dislocations and deleting each threading dislocation (preventing propagation of each threading dislocation to upward) during epitaxial growth is rather prevented.

The present invention has been accomplished in an attempt to solve the aforementioned problems, and an object of the present invention is to form a separated growth region whose edge portion does not rise in epitaxial growth process.

Other object of the present invention is to suppress cracks (fractures) and decrease threading dislocations in the epitaxial growth of a group III nitride compound semiconductor.

In order to solve the aforementioned problems, the invention drawn to a first feature provides a method for fabricating a Group III nitride compound semiconductor on a substrate through epitaxial growth, which method comprises steps of: forming a mask material, on which a group III nitride compound semiconductor does not epitaxially grow, in grid pattern on the surface of the substrate, zoning the surface of the substrate into each device formation region to be exposed, and forming a consumption region for a group III nitride compound semiconductor at each central portion of a band of the mask formed in grid pattern; and forming a group III nitride compound semiconductor on each of the exposed and zoned substrate surface as the device formation region. Here the central portion of the mask does not necessarily refer to only the central portion continued over the whole area of the band of the mask in grid form but refers to, for example, the area in broken line pattern, scattered dot pattern and other arbitrary pattern. Forming the consumption region may be carried out at the same time of forming the mask material in grid pattern or after forming the mask material in grid pattern.

The invention drawn to a second feature is that the consumption region is formed by exposing some portion of the surface of the substrate which is not used to form a device.

The invention drawn to a third feature is that the consumption region is formed by removing even a portion of the substrate and exposing the substrate surface having a step. The present invention also encompasses the case having a process of removing a portion of the substrate to obtain a substrate surface with a step at first and then forming the mask material in grid pattern.

The invention drawn to a fourth feature is that the area of the device formation region is from 0.01 $mm^2$ to 1 $mm^2$. The invention drawn to a fifth feature is that the area of the device formation region is from 0.01 $mm^2$ to 0.03 $mm^2$.

The invention drawn to a sixth feature is that the substrate is made of silicon (Si). The invention drawn to a seventh feature is that the mask material is mainly made of silicon dioxide ($SiO_2$). The invention drawn to an eighth feature provides a method for fabricating a Group III nitride compound semiconductor further comprising a step of forming a reaction prevention layer mainly made of a monocrystal on each of the exposed zoned substrate surface as the device formation region so that the substrate may not react with the Group III nitride compound semiconductor formed on the substrate during the process of fabricating a Group III nitride compound semiconductor. The present invention does not exclude the case in which the reaction prevention layer is formed in the consumption region. The invention drawn to a ninth feature is that thickness of the reaction prevention layer is from 100 nm to 1 μm. The invention drawn to a tenth feature is that the reaction prevention layer is made of group III nitride compound semiconductor and aluminum (Al) composition of group III material has molar fraction of 30% or more.

The invention drawn to an eleventh feature provides a Group III nitride compound semiconductor device which is formed on the Group III nitride compound semiconductor fabricated by a method for fabricating a Group III nitride compound semiconductor according to any one of the first to tenth feature. The invention drawn to a twelfth feature provides a Group III nitride compound semiconductor light-emitting device which comprises another Group III nitride compound semiconductor layer deposited on the Group III nitride compound semiconductor fabricated by a method for fabricating a Group III nitride compound semiconductor according to any one of the first to tenth feature.

In the epitaxial growth process with each growth region separated by a mask formed in grid pattern, because the consumption region of the Group III nitride compound semiconductor is formed in the central portion of each band of the mask between each adjacent edge portion of the growth region, Group III or Group V raw material is never unnecessarily supplied to the edge portion of the growth region. As a result, difference of group III or group V rare material supply amount to the edge portion and central portion of the device formation region is suppressed and the edge portion of the device region may not be convexity, resulting in remarkably decreasing cracks and defects in the device formation region (the first feature).

The consumption region may be formed by just exposing the substrate surface which is not used to form a device. Alternatively the consumption region may be formed even by removing a portion of the substrate to form a step (the second and third features).

The area of the device formation area may preferably be 0.01 $mm^2$ to 1 $mm^2$ and further preferably 0.01 $mm^2$ to 0.3 $mm_2$. An epitaxial growth layer formed to have several μm of thickness at an area larger than 1 $mm^2$ may have remarkable numbers of cracks owing to stress. When an area is formed to be smaller than 0.3 $mm^2$, each epitaxial growth region is assigned to about a device unit. As a result, yield rate of the device can be further improved (the fourth and fifth features). When an area is formed to be smaller than 0.01 $mm^2$, each epitaxial growth region is not sufficient for an area which one device unit is formed.

The present invention is especially useful when a substrate is made of silicon (Si) whose thermal expansion coefficient is largely different from that of a group III nitride compound semiconductor (the sixth feature). It is simple and easy to use silicon dioxide ($SiO_2$) to form the mask material (the seventh feature). The reaction prevention layer can prevent the substrate from reacting with a group III nitride compound semiconductor deposited thereon during the fabricating process (the eighth feature). Thickness of the reaction prevention layer needs to be at least 100 nm (the ninth feature), and is preferably made of group III nitride compound semiconductor whose aluminum (Al) composition of group III material has molar fraction of 30% or more (the tenth feature). As a result, for example, when AlGaN is formed between the silicon (Si) substrate and gallium nitride (GaN), the silicon (Si) substrate and the gallium nitride (GaN) are formed not to contact with each other directly. That enables to prevent generation of silicon nitride, metal gallium and so on owing to nitride atoms moving in the silicon (Si) substrate from the gallium nitride (GaN). Generally, forming a reaction prevention layer on a substrate which may react with a group III nitride compound semiconductor under a certain condition may be useful and effective.

A device formed on an objective group III nitride compound semiconductor layer formed as described above and a light-emitting device comprising group III nitride compound semiconductor layers which are different from the objective layer can suppress generation of both cracks and threading dislocations at the same time. As a result, a device or a light-emitting device whose yield rate and quality is remarkably high can be obtained (the eleventh and twelfth features).

The invention drawn to a thirteenth feature provides a method for fabricating a Group III nitride compound semiconductor, in which a Group III nitride compound semiconductor is formed on a substrate through epitaxial growth, comprising steps of: a process of forming a mask material, on which a group III nitride compound semiconductor does not epitaxially grow, in grid pattern on the substrate surface, zoning the substrate surface into each region to be exposed; a process of forming a strain relaxation layer comprising group III nitride compound semiconductors, each of which is formed at each two different range of temperature and has equivalent or different composition, deposited alternately on an upper portion of the surface of the substrate which is zoned with each other and is exposed; and a process of forming a group III nitride compound semiconductor on the strain relaxation layer, wherein the group III nitride compound semiconductor deposited in the portion of the substrate surface are separated with each other. Here grid pattern in which the mask material is formed does not necessarily have a square window. Alternatively, it may have, for example, a polygon window like honeycomb. And when group III nitride compound semiconductors are deposited alternately to form the strain relaxation layer, each layer is formed at each different range of temperature, or at the two ranges of temperature which are not needed to be perfectly the same range with each other.

The invention drawn to a fourteenth feature is that the two different ranges of temperature are the range from 200° C. to 600° C. and from 900° C. to 1200° C., respectively. The invention drawn to a fifteenth feature is that the group III nitride compound semiconductor layer formed at the temperature from 200° C. to 600° C. has a thickness from 10 nm to 100 nm and the group III nitride compound semiconductor layer formed at the temperature from 900° C. to 1200° C. has a thickness from 200 nm to 1 μm. The invention drawn to a sixteenth feature is that the process of forming the strain relaxation layer comprises a step of forming a pair of group III nitride compound semiconductor layers at two different ranges of temperature two times or more.

The invention drawn to a seventeenth feature is that an area of the substrate surface which is zoned with each other and is exposed is from 1 $mm^2$ or less. The invention drawn to an eighteenth feature is that an area of the substrate surface which is separated with each other and is exposed is 0.3 $mm^2$ or less.

The invention drawn to a nineteenth feature is that the substrate is made of silicon (Si). The invention drawn to a twentieth feature is that the mask material is mainly made of silicon dioxide ($SiO_2$). The invention drawn to a twenty-first feature provides a method for fabricating a Group III nitride compound semiconductor, further comprising a step of forming a reaction prevention layer mainly made of a monocrystal on the substrate surface which is zoned with each other and is exposed in order to prevent the substrate from reacting with the group III nitride compound semiconductor deposited thereon during production. The reaction prevention layer mainly made of monocrystalline means that the layer is formed under conditions including the temperature at which the reaction prevention layer becomes monocrystalline except for crystal condition around the substrate surface. The invention drawn to a twenty-second feature is that the reaction prevention layer has thickness from 100 nm to 1 μm.

The invention drawn to a twenty-third feature is that the reaction prevention layer is made of a group III nitride compound semiconductor whose aluminum (Al) composition of group III material has molar fraction of 30% or more.

The invention drawn to a twenty-fourth feature provides a group III nitride compound semiconductor device which is fabricated by a method for fabricating a group III nitride compound semiconductor according to any one of the thirteenth to twenty-third features. The invention drawn to a twenty-fifth feature provides a group III nitride compound semiconductor light-emitting device comprising another Group III nitride compound semiconductor layer deposited on the Group III nitride compound semiconductor fabricated by a method for fabricating a Group III nitride compound semiconductor according to any one of the thirteenth to twenty-third features.

Because the mask material on which a group III nitride compound semiconductor can not epitaxially grow is formed in grid pattern on the substrate surface to separate it into each region and exposes them, the area on which the group III nitride compound semiconductor is formed through epitaxial growth can be a small area independent from each other. Then group III nitride compound semiconductors each of which is formed at each different range of temperature and has equivalent or different composition are deposited alternately to form the strain relaxation layer. That can relax stress generated between the substrate and the upper layer formed on the strain relaxation layer, to thereby suppress generation of threading dislocations or extinguish threading dislocations at the upper layer of the layers formed through epitaxial growth. The objective group III nitride compound semiconductor is formed on the strain relaxation layer, and it can prevent generation of cracks and suppress threading dislocations (the thirteenth feature).

The two different ranges of temperature are preferably 200° C. to 600° C. and 900° C. to 1200° C., respectively, and the layer formed at the lower temperature range and the layer formed at the higher temperature range are preferably deposited alternately. Stress is relaxed in a low-temperature growth layer and is more relaxed in the upper part of a high-temperature growth layer because of monocrystalline. As a result, the strain relaxation layer with suppressed threading dislocations can be obtained (the fourteenth feature). The low-temperature growth layer may be preferably formed thinner and the high-temperature growth layer thicker, and each the low-temperature growth layer and the high-temperature growth layer may preferably have thickness of 10 nm to 100 nm and 200 nm to 1 μm, respectively (the fifteenth feature). The more the pair of group III nitride compound semiconductor layers formed at two different ranges of temperature are deposited in the strain relaxation layer, the more stress may be relaxed. So a pair of a low-temperature growth layer and a high-temperature growth layer may be preferably formed in the strain relaxation layer two times or more (the sixteenth feature).

An area of the substrate surface which is zoned with each other and is exposed may preferably be 0.01 $mm^2$ to 1 $mm^2$ and further preferably 0.01 $mm^2$ to 0.3 $mm^2$. An epitaxial growth layer formed to have several μm of thickness at an area larger than 1 $mm^2$ may have remarkable numbers of cracks owing to stress. When the exposed area is formed to be smaller than 0.3 $mm^2$, each epitaxial growth region is about a device unit. As a result, yield rate of the device can be further improved (the seventeenth and eighteenth features). When the exposed area is formed to be smaller than 0.01 $mm^2$, each epitaxial growth region is not sufficient for an area on which one device unit is formed.

The present invention is especially useful when a substrate is made of silicon (Si) whose thermal expansion coefficient is largely different from that of a group III nitride compound semiconductor (the ninteenth feature). It is simple and easy to use silicon dioxide ($SiO_2$) to form the mask material (the twentieth feature). The reaction prevention layer which is mainly made of monocrystalline and is formed on the exposed substrate surface can prevent the substrate from reacting with the group III nitride compound semiconductor deposited thereon owing to stress generated during the fabricating process such as epitaxial growth, forming electrode, photolithography, etching and other treatment, heating or cooling process down to the ambient temperature (the twenty-first feature). Thickness of the reaction prevention layer needs to be at least 100 nm (the twenty-second feature), and is preferably made of group III nitride compound semiconductor whose aluminum (Al) composition of group III material has molar fraction of 30% or more (the twenty-third feature). As a result, for example, when AlGaN is formed between the silicon (Si) substrate and gallium nitride (GaN), the silicon (Si) substrate and the gallium nitride (GaN) are formed not to contact with each other directly. That enables to prevent generation of silicon nitride, metal gallium and so on owing to nitride atoms moving in the silicon (Si) substrate from the gallium nitride (GaN). Generally, forming a reaction prevention layer on a substrate which may react with a group III nitride compound semiconductor under a certain condition may be useful and effective.

A device formed on an objective group III nitride compound semiconductor layer formed as described above and a light-emitting device comprising group III nitride compound semiconductor layers which are different from the objective layer can suppress generation of both cracks and threading dislocations at the same time. As a result, a device or a light-emitting device whose yield rate and quality is remarkably high can be obtained (the twenty-fourth and twenty-fifth features). Forming layers on each zoned growth region helps to decrease warp of the substrate remarkably compared with when layers are deposited on the entire surface of the substrate. As a result, yield rate of the device may be improved.

BEST MODE FOR CARRYING OUT THE INVENTION

Embodiments of the present invention will next be described with reference to the drawings. Characteristic features of the present invention which have been described above is also the best mode for the invention, and the present invention is not limited to the below-described specific embodiments.

Figure 1A:
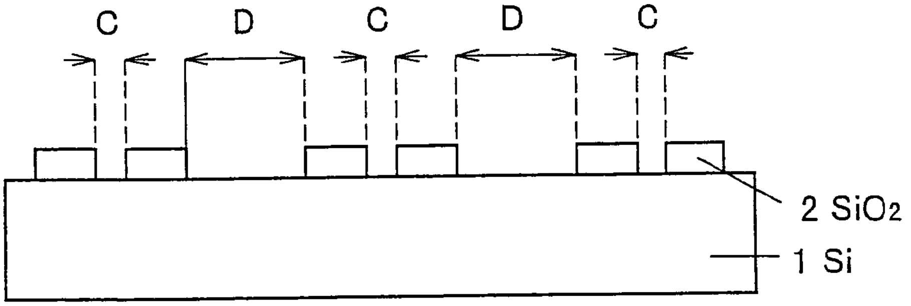
FIGS. 1A and 1B are a series of cross sectional views showing the steps of fabricating a Group III nitride compound semiconductor according to a first embodiment of the present invention.
Figure 1B:
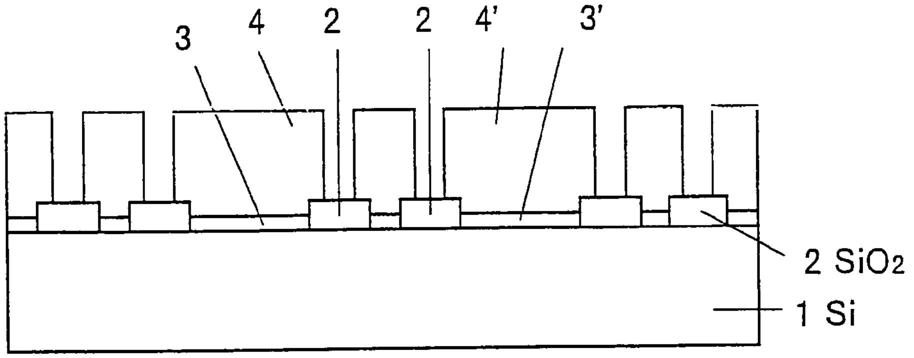
Figure 2A:
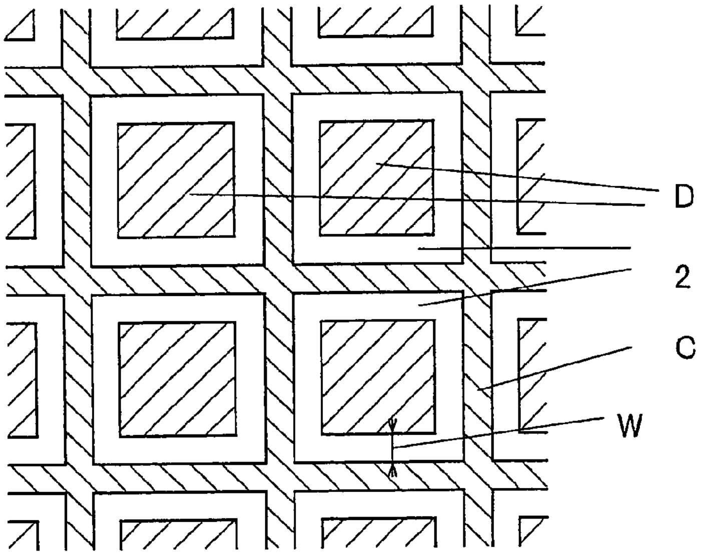
FIGS. 2A–2C are a series of plain views showing the silicon oxide ($SiO_2$) formed in a pane shape according to a first embodiment of the present invention.
Figure 2B:
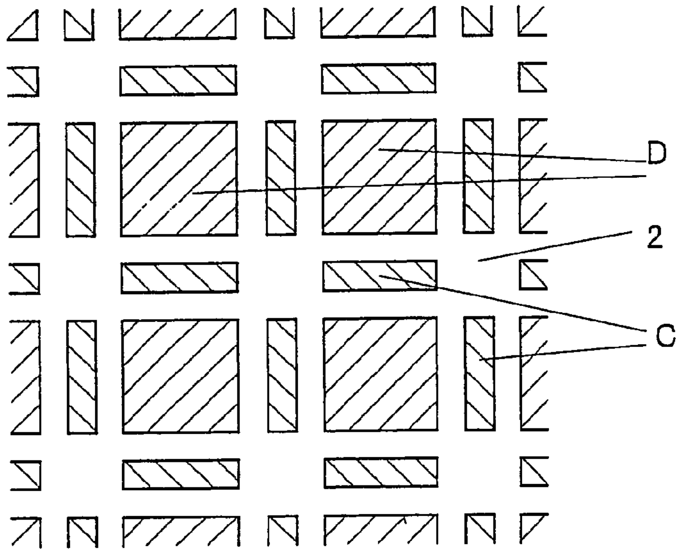
Figure 2C:
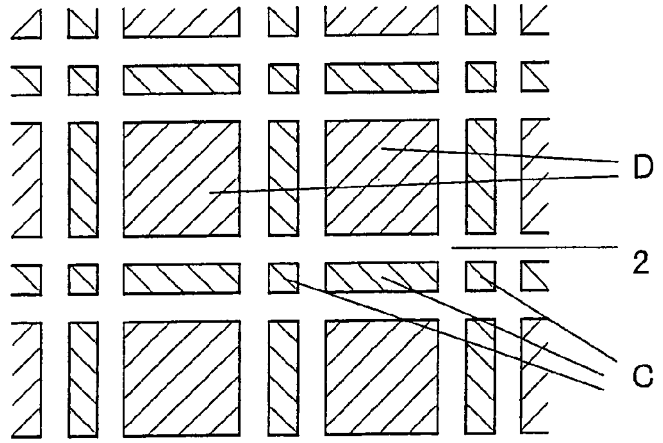
Figure 3A:
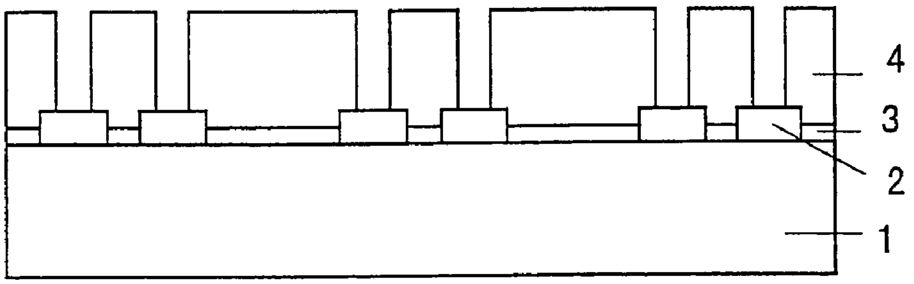
FIGS. 3A and 3B are cross sectional views showing the sidewalls of an epitaxial growth layer according to the first embodiment of the present invention.
Figure 3B:
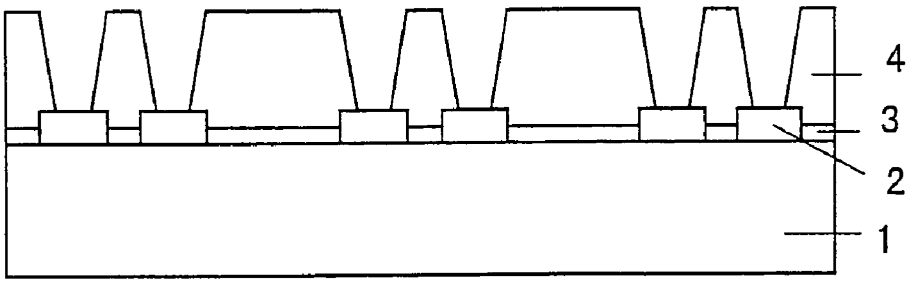

FIGS. 1A and 1B are cross sectional views showing the structure of an embodiment of the present invention. A mask material made of silicon oxide ($SiO_2$) 2 is formed on a silicon (Si) substrate 1. The mask material 2 is mainly formed in a pane shape, and the silicon (Si) substrate 1 is exposed at its window part. Further, the silicon (Si) substrate 1 is also exposed in a band shape at the center part of the pane part (FIG. 1A). FIGS. 2A–2C are a series of plane views showing the structure of the mask material 2. Each square part represented by D in FIGS. 2A–2C is a device formation region and each band part represented by C is a consumption region. The consumption region C formed in a band shape may be formed in sequence all over the wafer as shown in FIG. 2A and alternatively the consumption region C may be separated in each side as shown in FIG. 2B. Preferably the consumption region C may be formed to be continuous because stress concentrates to the region more easily and cracks generated in the device formation area can be decreased. Alternatively, the consumption region C may be formed at each crossing part of the lines of the pane parts (a portion adjacent to the corner of the device formation region) as shown in FIG. 2C. Then a reaction prevention layer 3 is formed by epitaxial growth on the exposed surface of the silicon (Si) substrate 1, i.e., on both of the device formation region D and the consumption region C. The reaction prevention layer 3 functions to prevent the silicon (Si) substrate 1 from reacting with a group III nitride compound semiconductor deposited thereon and is mainly monocrystalline. Next a GaN layer 4 is formed as an objective group III nitride compound semiconductor layer on the reaction prevention layer 3 through epitaxial growth. Here the lamination part comprising the reaction prevention layer 3 and the GaN layer 4 is formed so as not to contact to the lamination part comprising a reaction prevention layer 3' and a GaN layer 4' which is formed on the next exposed surface of the substrate 1 in the epitaxial growth process. Similarly, a layer depsosited on the device formation region D is formed so as not to contact to a layer deposited on the consumption region C in the epitaxial growth process. In short, even when the group III nitride compound semiconductor layer 4 is formed on the edge portion of the mask material 2, epitaxial growth process is carried out in condition that the group III nitride compound semiconductor layer 4 does not cover the mask material 2 to its central part (FIG. 1B). In concrete, forming such a group III nitride compound semiconductor layer 4 may be achieved by suppressing lateral growth with varying reaction condition such as growth temperature and growth velocity. If width of the pane part of the mask material 2 is sufficiently large, growth velocity of the edge part becomes larger compared with that of the central part of the mask material 2. Accordingly, width of the pane part of the mask material 2 is arranged to be 20 μm or less, preferably 1 μm to 10 μm. The present invention includes that the lamination part comprising the reaction prevention layer 3 and the GaN layer 4 has a plane perpendicular to the surface of the substrate 1 on the upper portion of the mask material 2 as shown in FIG. 3A and an inclined plane as shown in FIG. 3B. In FIGS. 1A–1B, FIGS. 4A–4B and their sequent figures, the lamination part is illustrated as in FIG. 3A. But that does not exclude the lamination part shown in FIG. 3B.

Figure 4A:
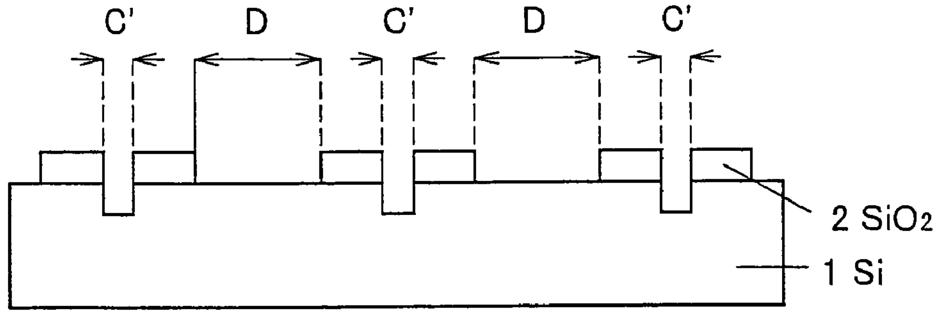
FIGS. 4A and 4B are a series of cross sectional views showing the steps of fabricating a Group III nitride compound semiconductor according to a second embodiment of the present invention.
Figure 4B:
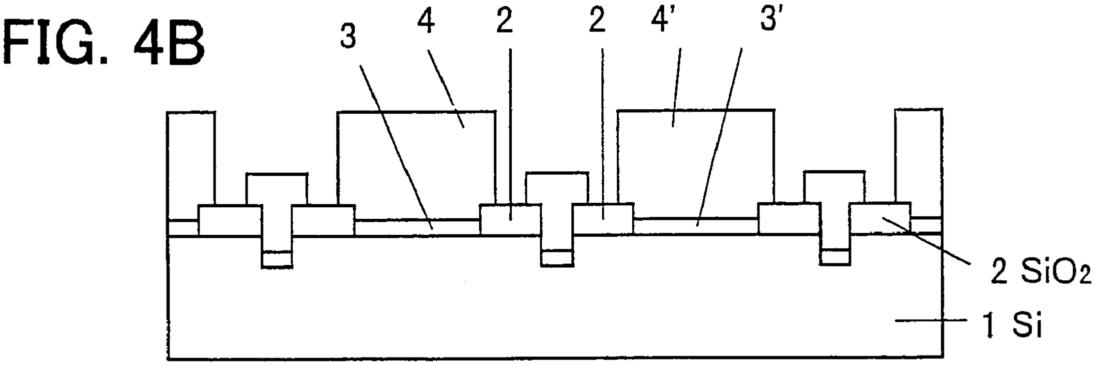

FIGS. 4A–4B are cross-sectional views showing a structure according to an embodiment of the present invention. The mask material 2 made of silicon oxide ($SiO_2$) is formed on a silicon (Si) substrate 1. The mask material 2 is mainly formed in a pane shape, and the silicon (Si) substrate 1 is exposed at its window part. Further, the silicon (Si) substrate 1 is exposed having a trench in a band shape at the interspace of the pane part which is caved to the substrate 1 (FIG. 4A). A series of plane views showing the structure of the mask material 2 are same as those shown in FIGS. 2A–2C. Then an AlGaN reaction prevention layer 3 is formed through epitaxial growth on both of the exposed surface of silicon (Si) substrate 1, i.e., a device formation region D, and a consumption region C'. The reaction prevention layer 3 functions to prevent the silicon (Si) substrate 1 from reacting with a group III nitride compound semiconductor deposited thereon and is mainly monocrystalline. Next a GaN layer 4 is formed as an objective group III nitride compound semiconductor layer on the reaction prevention layer 3 through epitaxial growth. Here the lamination part comprising the reaction prevention layer 3 and the GaN layer 4 is formed so as not to contact to the lamination part comprising a reaction prevention layer 3' and a GaN layer 4' which is formed on the next exposed surface of the substrate 1 in the epitaxial growth process. Similarly, a layer deposited on the device formation region D is formed so as not to contact to a layer deposited on the consumption region C in the epitaxial growth process. In short, even when the group III nitride compound semiconductor layer 4 is formed on the edge portion of the mask material 2, epitaxial growth process is carried out in condition that the group III nitride compound semiconductor layer 4 does not cover the mask material 2 to its central part (FIG. 4B). In concrete, forming such a group III nitride compound semiconductor layer 4 may be achieved by suppressing lateral growth with varying reaction condition such as growth temperature and growth velocity. If width of the pane part of the mask material 2 is sufficiently large, growth velocity of the edge part becomes larger compared with that of the central part of the mask material 2. Accordingly, the width of the pane part of the mask material 2 is arranged to be 20 μm or less, preferably 1 μm to 10 μm. Also, forming the group III nitride compound semiconductor 4 having structure described above may be easily obtained by enlarging the trench of the consumption region C'.

The present invention can be carried out with reference to the following description.

When Group III nitride compound semiconductor layers are successively formed on a substrate, the substrate may be formed of an inorganic crystal compound such as sapphire, silicon (Si), silicon carbide (S/C), spinel ($MgAl_2O_4$), $LiGaO_2$, $NdGaO_3$, ZnO, or MgO; a Group III–V compound semiconductor such as gallium phosphide or gallium arsenide; or a Group III nitride compound semiconductor such as gallium nitride (GaN). Alternatively, a substrate, on which a film made of gallium nitride (GaN) or other group III nitride compound semiconductor is deposited, or especially a buffer layer or thick film is further deposited, may be used.

A preferred process for forming a Group III nitride compound semiconductor layer is metal-organic chemical vapor deposition (MOCVD) or metal-organic vapor phase epitaxy (MOVPE). However, molecular beam epitaxy (MBE), halide vapor phase epitaxy (halide VPE), liquid phase epitaxy (LPE), or the like may be used. Also, individual layers may be formed by different growth processes.

The present invention is substantially applicable even when the composition of a Group III nitride compound semiconductor are such that a portion of Group III elements are replaced with boron (B) or thallium (Tl) or a portion of nitrogen (N) atoms are replaced with phosphorus (P), arsenic (As), antimony (Sb), or bismuth (Bi). Also, the Group III nitride compound semiconductor may be doped with any one of these elements to such an extent as not to appear in the composition thereof. For example, a Group III nitride compound semiconductor which is represented by $Al_xGa_{1-x}N$ ($0 \leqq x \leqq 1$) and which does not contain indium (In) or arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms. In this case, since acceptor impurities easily occupy the sites of Group III atoms, p-type crystals can be obtained as grown. Through the thus-attained improvement of crystallinity combined with the features of the present invention, threading dislocation can be further reduced to approximately 1/100 to 1/1,000. In the case where a light-emitting element is a target product, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

Combining with the present invention, the Group III nitride compound semiconductor layer may be formed by employing lateral epitaxial growth. That is, the Group III nitride compound semiconductor is formed on the device formation region by the method of the present invention and further a Group III nitride compound semiconductor may be formed thereon by lateral epitaxial growth to decrease threading dislocations. The lateral epitaxial growth preferably progresses such that the front of lateral epitaxial growth is perpendicular to a substrate. However, lateral epitaxial growth may progress while slant facets with respect to the substrate are maintained. In this case, trenches may have a V-shaped cross section.

A mask material which zones the device formation region in the present invention may be formed of a polycrystalline semiconductor such as polycrystalline silicon or a polycrystalline nitride semiconductor; an oxide or a nitride, such as silicon oxide ($SiO_x$), silicon nitride ($SiN_x$), titanium oxide ($TiO_x$), or zirconium oxide ($ZrO_x$); or a metal having high melting point, such as titanium (Ti) or tungsten (W) and may be also a multi-layer film made of those material. The film may be formed through any known method, such as a vapor-growth method (e.g., deposition, sputtering, or CVD).

The reaction prevention layer functions to prevent the substrate from reacting with a group III nitride compound semiconductor deposited thereon in a process of producing the Group III nitride compound semiconductor. For example, it is well known that when there is no layer between the silicon (Si) substrate and the GaN layer or when a thin layer is formed therebetween, stress promotes reaction in the producing process, nitrogen atoms drop off from GaN and combine with the silicon (Si) substrate to form a silicon nitride. That is well known. So the reaction prevention layer is preferably monocrystalline and has sufficient thickness. It may be preferably made of a group III nitride compound semiconductor $Al_xGa_yIn_{1-x-y}N$ (e.g., $x \geqq 0.3$) containing much aluminum (Al). Since aluminum (Al) strongly combines with nitrogen, silicon (Si) hardly reacts with GaN by increasing aluminum (Al). Also it is important that the reaction prevention layer is not made of non-crystal material like a buffer layer but is mainly monocrystalline.

Alternatively, a strain relaxation layer in which non-crystal layers and monocrystalline layers are laminated may be formed. A plurality of units each comprising the non-crystal layer and the monocrystalline layer may be formed, and the number of such units is not particularly limited. The greater the number of units, the greater the improvement in crystallinity. A Group III nitride compound semiconductor grown at low temperature is preferable to form the non-crystal layer, and more preferably the non-crystal layer comprises aluminum (Al). A Group III nitride compound semiconductor grown at high temperature is preferable to form the monocrystalline layer, and a binary Group III nitride compound semiconductor except for a conductive dopant is more preferable. Alternatively, atoms which is larger in atomic radius, e.g., indium (In), may be doped into the monocrystalline layer.

In order to form an electrode or to obtain lateral epitaxial growth, reactive ion etching (RIE) is preferred to etch the Group III nitride compound semiconductor, but any other etching process may be employed. When trenches having sidewalls oblique to the surface of the substrate are to be formed, anisotropic etching is employed. By means of anisotropic etching, trenches are formed such that the trenches have a V-shaped cross section.

A semiconductor device such as an FET or a light-emitting device can be formed on the above-described Group III nitride compound semiconductor having regions where threading dislocation is suppressed. In the case of a light-emitting device, the device may have a light-emitting layer having a multi-quantum well (MQW) structure or a single-quantum well (SQW) structure, a homo-structure, a single-hetero-structure, or a double-hetero-structure, and may be formed by means of, for example, a pin junction or a pn junction.

Embodiments of the present invention in which light-emitting devices are produced will next be described. The present invention is not limited to the embodiments described below. The present invention discloses a method for fabricating a Group III nitride compound semiconductor applicable to fabrication of any device.

The Group III nitride compound semiconductor of the present invention was produced through metal-organic vapor phase epitaxy (hereinafter called "MOVPE"). The following gasses were employed: ammonia ($NH_3$), carrier gas ($H_2$ or $N_2$), trimethylgallium ($Ga(CH_3)_3$, hereinafter called "TMG"), trimethylaluminum ($Al(CH_3)_3$, hereinafter called "TMA"), trimethylindium ($In(CH_3)_3$, hereinafter called "TMI"), and cyclopentadienylmagnesium ($Mg(C_5H_5)_2$, hereinafter called "$Cp_2Mg$")

[First Embodiment]

300 nm in thickness of silicon oxide ($SiO_2$) film 2 was formed on (111) plane of an n-type silicon (Si) substrate 1 through sputtering. A resist mask was formed on it through photolithography, and the silicon oxide ($SiO_2$) film was subjected to wet etching using buffered HF and removed so as to remain the film in a pane shape. Each pane had a width of 10 μm and the exposed portion of (111) surface of the silicon (Si) substrate at which the silicon oxide ($SiO_2$) film 2 was removed has regions of 300 μm×300 μm square and a region in lattice shape having a width of 50 μm at its central part (FIG. 2A). Accordingly, a lot of 300 μm×300 μm squares which were separated with each other and region in lattice shape whose width of the inter-pane was 50 μm were obtained as the exposed surface D of the silicon (Si) substrate 1 and the exposed surface C, respectively (FIG. 1A). The width of the silicon oxide ($SiO_2$) film 2 formed in a pane shape (width W in FIG. 1A) was 10 μm.

Next, while the temperature of the n-type silicon (Si) substrate 1 was maintained at 1100° C., TMA, TMG, $SiH_4$ and $NH_3$ were introduced to thereby form 300 nm in thickness of n-AlGaN:Si reaction prevention layer 3 on the (111) plane of the silicon (Si) substrate 1 exposed in a square shape of 300 μm×300 μm. Molar fraction of Al and Ga in the n-AlGaN:Si layer was approximately 3:7.

Next, while the temperature of the n-type silicon (Si) substrate 1 was raised to 1100° C., TMG, $SiH_4$ and $NH_3$ were introduced to thereby form 5 μm in thickness of n-GaN:Si layer 4 on the reaction prevention layer 3. After that the thus-obtained n-GaN:Si layer 4 was formed over the surface of the silicon (Si) substrate 1 which was exposed to be regions each having a square shape of 300 μm×300 μm and separated by the silicon oxide ($SiO_2$) film 2 formed in a pane shape. Even when a portion of the n-GaN:Si layer 4 was formed on the edge of the silicon oxide ($SiO_2$) film 2, it was kept separated from the n-GaN:Si layer 4' deposited over the exposed 300 μm×300 μm square region of the silicon (Si) substrate 1 and the n-GaN:Si layer 4C deposited over the exposed plane C with 50 μm width which was the interspace of the plane (FIG. 1B). The temperature of thus-obtained n-GaN:Si layer 4 was cooled down to the ambient temperature at a rate of 20° C./min., but no cracks were generated. And difference of the thicknesses of the peripheral edge part and the central part of the device formation region was 50 nm or less.

[Second Embodiment]

A resist mask was formed on (111) plane of the n-type silicon (Si) substrate 1 through photolithography, and the substrate 1 was subjected to wet etching using hydrofluoric acid/hydrogen peroxide, to thereby obtain a groove part C' having width of 50 μm and depth of 4 μm etched in a pane form. The region surrounded by the pane part was a 310 μm×310 μm quadrate. Then 300 nm in thickness of silicon oxide ($SiO_2$) film 2 was formed through sputtering. A resist mask was formed on the film 2 through photolithography, and the silicon oxide ($SiO_2$) film was subjected to wet etching using buffered HF and removed so as to remain the film 2 in a pane shape. Each pane was formed to have a total width of 60 μm and have a groove part C' which was formed in a pane shape and had a width of 50 μm and a depth of 4pn in its central part. The exposed portion of (111) plane of the silicon (Si) substrate 1 at which the silicon oxide ($SiO_2$) film 2 was removed had regions of 300 μm×300 μm square (FIG. 2A). Accordingly, a lot of 300 μm×300 μm squares which were separated with each other and region in lattice shape whose width and depth of the central part was 50 μm and 4 μm, respectively, were obtained as the exposed plane D of the silicon (Si) substrate 1 and the exposed plane (groove part) C', respectively (FIG. 1A).

Next, while the temperature of the n-type silicon (Si) substrate 1 was maintained at 1100° C., TMA, TMG, $SiH_4$ and $NH_3$ were introduced to thereby form 300 nm in thickness of n-AlGaN:Si reaction prevention layer 3 on (111) plane of the silicon (Si) substrate 1 exposed in a square shape of 300 μm×300 μm. Molar fraction of Al and Ga in the n-AlGaN:Si layer was approximately 3:7.

Next, while the temperature of the n-type silicon (Si) substrate 1 was raised to 1100° C., TMG, $SiH_4$ and $NH_3$ were introduced to thereby form 5 μm in thickness of n-GaN:Si layer 4 on the reaction prevention layer 3. After that the thus-obtained n-GaN:Si layer 4 was formed on the surface of the silicon (Si) substrate 1 which was exposed to be regions each having a square shape of 300 μm×300 μm and separated by the silicon oxide ($SiO_2$) film 2 formed in a pane shape. Even when a portion of the n-GaN:Si layer 4 was formed on the edge of the silicon oxide ($SiO_2$) film 2, it was kept separated from the n-GaN:Si layer 4' deposited on the exposed 300 μm×300 μm square region of the silicon (Si) substrate 1 and the n-GaN:Si layer 4C deposited on the exposed plane C whose width and depth of the central part in a pane shape was 50 μm and 4 μm, respectively (FIG. 1B). The temperature of thus-obtained n-GaN:Si layer 4 was cooled down to the ambient temperature at a rate of 20° C./min., but no cracks were generated. And difference of the thicknesses of the peripheral edge part and the central part of the device formation region was 50 nm or less.

[Third Embodiment]

Figure 5:
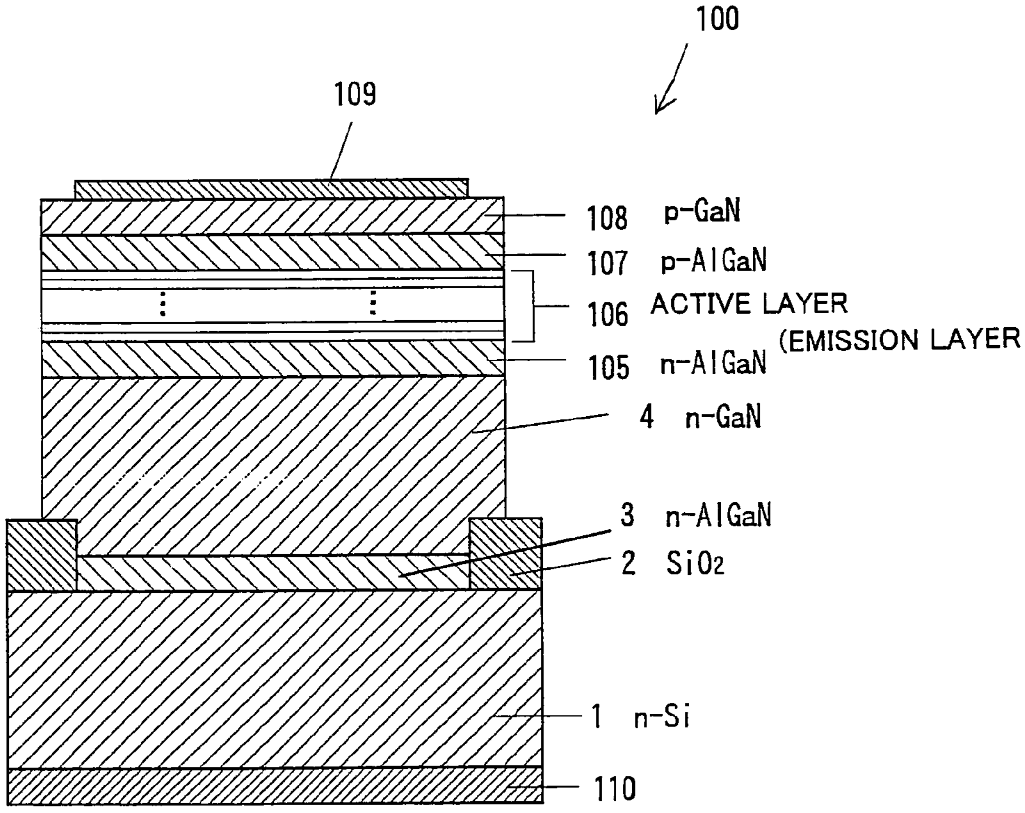
FIG. 5 is a cross sectional view showing the structure of a Group III nitride compound semiconductor light-emitting device according to a third embodiment of the present invention.

By carrying out similar process to that of the first embodiment, the n-GaN:Si layer 4 was deposited on the exposed 300 μm×300 μm square region of the silicon (Si) substrate 1, and group III nitride compound semiconductor was deposited thereon in sequence as follows to thereby obtain a light-emitting diode 100 shown in FIG. 5.

Silicon (Si) doped $Al_{0.08}Ga_{0.92}N$ n-clad layer 105, an emission layer 106, magnesium (Mg) doped $Al_{0.08}Ga_{0.92}N$ p-clad layer 107 and magnesium (Mg) doped GaN p-contact layer 108 were deposited in sequence on the n-GaN:Si layer 4. An electrode 109 made of gold (Au) was formed on the p-contact layer 108 and an electrode 110 made of aluminum (Al) was formed on the back surface of the silicon substrate 1. The thus-formed light-emitting diode (LED) 100 exhibited the remarkable improvement of device life time and light-emitting efficiency.

[Fourth Embodiment]

Figure 6:
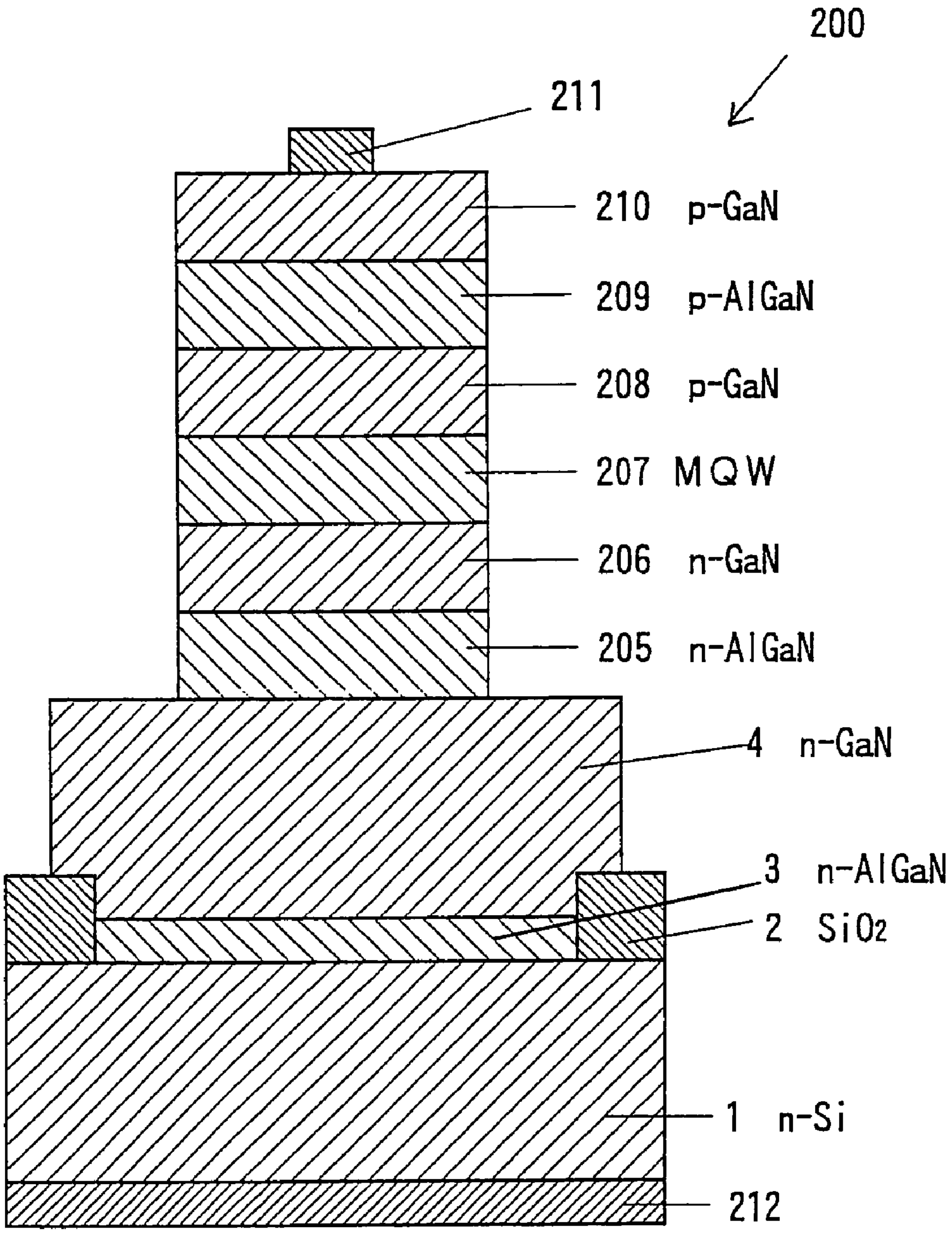
FIG. 6 is a cross sectional view showing the structure of a Group III nitride compound semiconductor light-emitting device according to a fourth embodiment of the present invention.

By carrying out similar process to that of the first embodiment, the n-GaN:Si layer 4 was deposited on the exposed 300 μm×300 μm square region of the silicon (Si) substrate 1, and group III nitride compound semiconductor was deposited thereon in sequence as follows to thereby obtain a light-emitting diode 200 shown in FIG. 6.

Silicon (Si) doped $Al_{0.08}Ga_{0.92}N$ n-clad layer 205, silicon (Si) doped GaN n-guide layer 206, an emission layer 207 having MQW structure, magnesium (Mg) doped GaN p-guide layer 208, magnesium (Mg) doped $Al_{0.08}Ga_{0.92}N$ p-clad layer 209 and magnesium (Mg) doped GaN p-contact layer 210 were deposited in sequence on the n-GaN:Si layer 4. An electrode 211 made of gold (Au) was formed on the p-contact layer 210 and an electrode 212 made of aluminum (Al) was formed on the back surface of the silicon substrate 1. The thus-formed light-emitting diode (LED) 200 exhibited the remarkable improvement of device life time and light-emitting efficiency.

Figure 7:
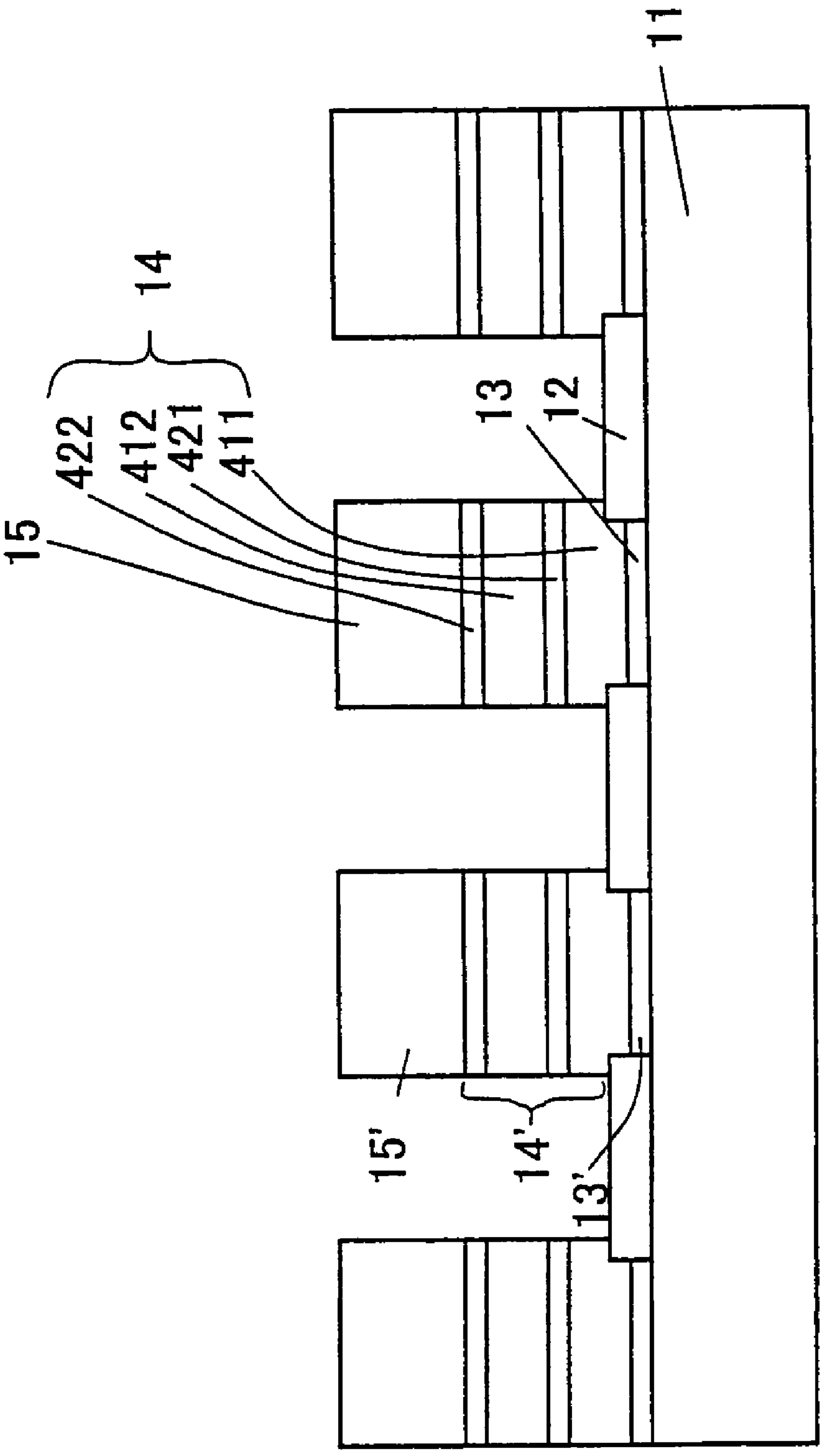
FIG. 7 is cross sectional view showing the steps of fabricating a Group III nitride compound semiconductor according to a fifth embodiment of the present invention.
Figure 8A:
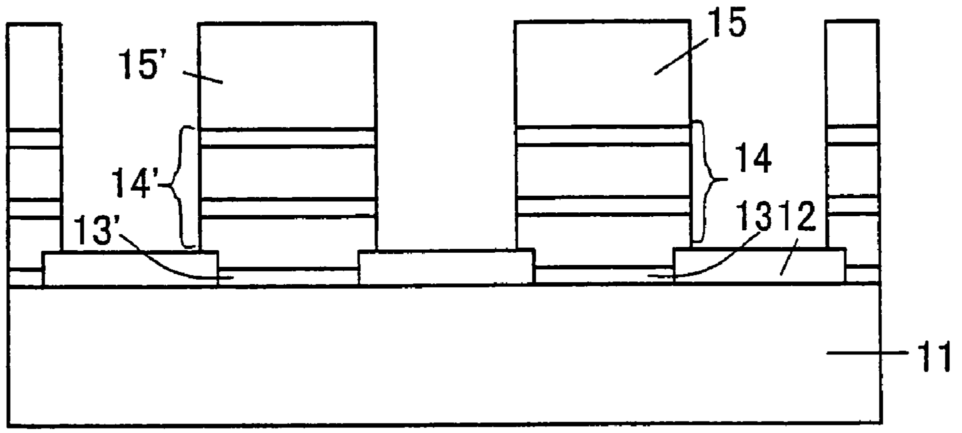
FIGS. 8A and 8B are cross sectional views showing the sidewalls of an epitaxial growth layer according to the fifth embodiment of the present invention.
Figure 8B:
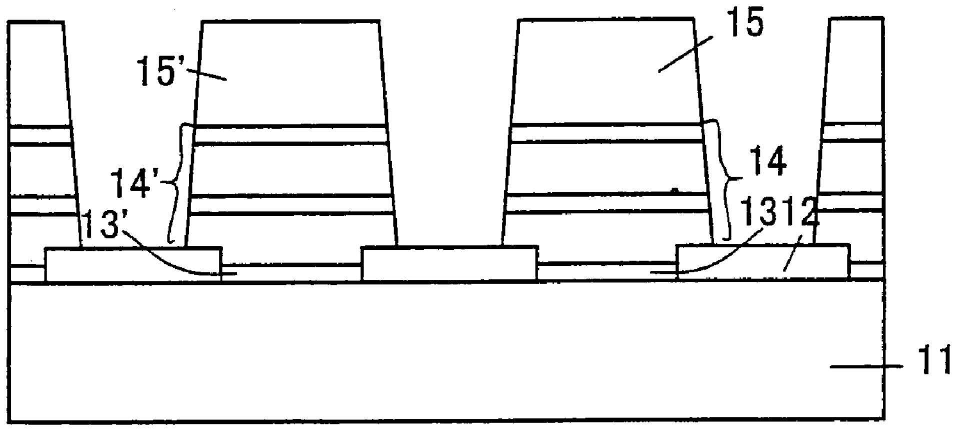
Figure 9:
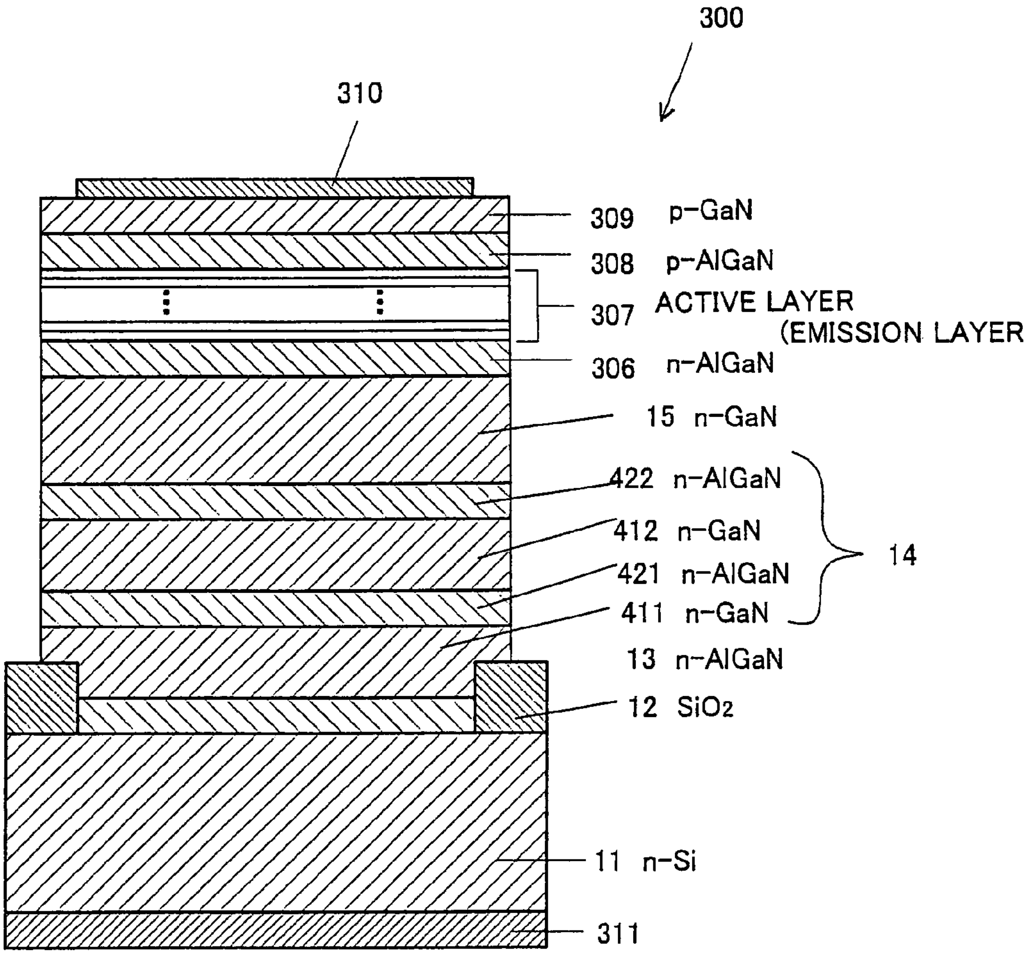
FIG. 9 is a cross sectional view showing the structure of a Group III nitride compound semiconductor light-emitting device according to a sixth embodiment of the present invention.

FIG. 7 illustrates a sectional view disclosed in other embodiment of the present invention. An mask material 12 made of silicon oxide ($SiO_2$) was formed on a silicon (Si) substrate 11. The mask material 12 was formed in a pane shape and the silicon (Si) substrate 1 was exposed at its window part. Then AlGaN reaction prevention layer 13 was formed on the exposed plane of the silicon (Si) substrate 11 through epitaxial growth. The reaction prevention layer 13 was formed to prevent silicon (Si) substrate 11 from reacting with a group III nitride compound semiconductor formed above and was mainly made of monocrystalline. Then a strain relaxation layer 14 having multiple layer structure was formed thereon through epitaxial growth. The strain relaxation layer 14 comprises GaN layers 411 and 412 and AlGaN layers 421 and 422, each of which was formed at each different range of temperature and was deposited alternatively. A GaN layer 15 as an objective group III nitride compound semiconductor layer was formed on the strain relaxation layer 14 through epitaxial growth. Here the lamination part comprising the reaction prevention layer 13, the strain relaxation layer 14 and the GaN layer 15 was formed so as not to contact to the lamination part comprising a reaction prevention layer 13', a strain relaxation layer 14' and a GaN layer 15' which was formed on the next exposed substrate 11 in epitaxial growth process. In short, the epitaxial growth process is carried out in condition that the strain relaxation layer 14 and the group III nitride compound semiconductor layer 15 does not cover the mask material 12 to its central part even when the strain relaxation layer 14 and the group III nitride compound semiconductor layer 15 is formed on the peripheral end portion of the mask material 12. In concrete, forming such layers may be achieved easily by forming the mask material 12 in a pane shape to have a sufficiently large width. The present invention includes the lamination part comprising the reaction prevention layer 13, the strain relaxation layer 14 and the GaN layer 15 having a plane perpendicular to the surface of the substrate 11 an the upper portion of the mask material 12 as shown in FIG. 8A and an inclined plane as shown in FIG. 8B. In FIG. 7, FIG. 9 and their sequent figures, the lamination part is illustrated having a plane shown in FIG. 8A. But that does not exclude the lamination part shown in FIG. 8B.

The present invention can be carried out with reference to the following description.

When Group III nitride compound semiconductor layers are successively formed on a substrate, the substrate may be formed of an inorganic crystal compound such as sapphire, silicon (Si), silicon carbide (SiC), spinel ($MgAl_2O_4$), $LiGaO_2$, $NdGaO_3$, ZnO, or MgO; a Group III–V compound semiconductor such as gallium phosphide or gallium arsenide; or a Group III nitride compound semiconductor such as gallium nitride (GaN). Alternatively, a substrate, on which a film made of gallium nitride (GaN) or other group III nitride compound semiconductor is deposited, or especially a buffer layer or thick film is further deposited, may be used.

A preferred process for forming a Group III nitride compound semiconductor layer is metal-organic chemical vapor deposition (MOCVD) or metal-organic vapor phase epitaxy (MOVPE). However, molecular beam epitaxy (MBE), halide vapor phase epitaxy (halide VPE), liquid phase epitaxy (LPE), or the like may be used. Also, individual layers may be formed by different growth processes.

The present invention is substantially applicable even when the composition of a Group III nitride compound semiconductor are such that a portion of Group III elements are replaced with boron (B) or thallium (Tl) or a portion of nitrogen (N) atoms are replaced with phosphorus (P), arsenic (As), antimony (Sb), or bismuth (Bi). Also, the Group III nitride compound semiconductor may be doped with any one of these elements to such an extent as not to appear in the composition thereof. For example, a Group III nitride compound semiconductor which is represented by $Al_xGa_{1-x}N$ ($0 \leqq x \leqq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms. In this case, since acceptor impurities easily occupy the sites of Group III atoms, p-type crystals can be obtained as grown. Through the thus-attained improvement of crystallinity combined with the features of the present invention, threading dislocation can be further reduced to approximately 1/100 to 1/1,000. In the case where a light-emitting element is a target product, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

Combining with the present invention, the Group III nitride compound semiconductor layer may be formed by employing lateral epitaxial growth. That is, decreasing threading dislocations by carrying out various kinds of lateral epitaxial growth processes in each upper region of the exposed substrate may be employed. Lateral epitaxial growth preferably progresses such that the front of lateral epitaxial growth is perpendicular to a substrate. However, lateral epitaxial growth may progress while slant facets with respect to the substrate are maintained. In this case, trenches may have a V-shaped cross section.

A mask material which zones the exposed region of the substrate in the present invention may be formed of a polycrystalline semiconductor such as polycrystalline silicon or a polycrystalline nitride semiconductor; an oxide or a nitride, such as silicon oxide ($SiO_x$), silicon nitride ($SiN_x$), titanium oxide ($TiO_x$), or zirconium oxide ($ZrO_x$); or a metal having high melting point, such as titanium (Ti) or tungsten (W) and may be also a multi-layer film made of those material. The film may be formed through any known method, such as a vapor-growth method (e.g., deposition, sputtering, or CVD).

The reaction prevention layer functions to prevent the substrate from reacting with a group III nitride compound semiconductor deposited thereon in a process of producing the Group III nitride compound semiconductor. For example, it is well known that when there is no layer between the silicon (Si) substrate and the GaN layer or when only a thin layer is formed therebetween, stress promotes reaction in the producing process, nitrogen atoms drop off from GaN and combine with the silicon (Si) substrate to form a silicon nitride. So the reaction prevention layer is preferably monocrystalline and has sufficient thickness. It may be preferably made of a group III nitride compound semiconductor $Al_xGa_yIn_{1-x-y}N$ (e.g., $x \geqq 0.3$) containing much aluminum (Al). Since aluminum (Al) strongly combines with nitrogen, silicon (Si) hardly reacts with GaN by increasing aluminum (Al). Also it is important that the reaction prevention layer is not made of a non-crystal material like a buffer layer but is mainly monocrystalline.

A non-crystal layers and monocrystalline layers are deposited in the strain relaxation layer. A plurality of units each comprising a non-crystal layer and a monocrystalline layer may be formed, and the number of such units is not particularly limited. The greater the number of units, the greater the improvement in crystallinity. A Group III nitride compound semiconductor grown at low temperature is preferable to form the non-crystal layer, and more preferably the non-crystal layer comprises aluminum (Al). A Group III nitride compound semiconductor grown at high temperature is preferable to form the monocrystalline layer, and a binary Group III nitride compound semiconductor except for a conductive dopant is more preferable. Alternatively, atoms which is larger in atomic radius, e.g., indium (In), may be doped into the monocrystalline layer.

In order to form an electron or to obtain lateral epitaxial growth, reactive ion etching (RIE) is preferred to etch the Group III nitride compound semiconductor, but any other etching process may be employed. When trenches having sidewalls oblique to the surface of the substrate are to be formed, anisotropic etching is employed. By means of anisotropic etching, trenches are formed such that the trenches have a V-shaped cross section.

A semiconductor device such as an FET or a light-emitting device can be formed on the above-described Group III nitride compound semiconductor having regions where threading dislocation is suppressed. In the case of a light-emitting device, the device may have a light-emitting layer having a multi-quantum well (MQW) structure or a single-quantum well (SQW) structure, a homo-structure, a single-hetero-structure, or a double-hetero-structure, and may be formed by means of, for example, a pin junction or a pn junction.

Embodiments of the present invention in which light-emitting devices are produced will next be described. The present invention is not limited to the embodiments described below. The present invention discloses a method for fabricating a Group III nitride compound semiconductor applicable to fabrication of any device.

The Group III nitride compound semiconductor of the present invention was produced through metal-organic vapor phase epitaxy (hereinafter called "MOVPE"). The following gasses were employed: ammonia ($NH_3$), carrier gas ($H_2$ or $N_2$), trimethylgallium ($Ga(CH_3)_3$, hereinafter called "TMG"), trimethylaluminum ($Al(CH_3)_3$, hereinafter called "TMA"), trimethylindium ($In(CH_3)_3$, hereinafter called "TMI"), and cyclopentadienylmagnesium ($Mg(C_5H_5)_2$, hereinafter called "$Cp_2Mg$")

[Fifth Embodiment]

500 nm in thickness of silicon oxide ($SiO_2$) film 12 was formed on (111) plane of an n-type silicon (Si) substrate 1 through sputtering. A resist mask was formed on it through photolithography, and the silicon oxide ($SiO_2$) film was subjected to wet etching using buffered HF and one part of the film is removed so as to remain the other part of the film in a pane shape. Each pane had a width of 50 μm and the exposed portion of (111) plane of the silicon (Si) substrate 11 at which the silicon oxide ($SiO_2$) film 12 was removed has regions of 300 μm×300 μm square. Accordingly, a lot of 300 μm ×300 μm squares of the exposed surfaces of the silicon (Si) substrate 11 which were separated with each other were obtained.

Next, while the temperature of the n-type silicon (Si) substrate 11 was maintained at 1100° C., TMA, TMG, $SiH_4$ and $NH_3$ were introduced to thereby form 300 nm in thickness of n-AlGaN:Si reaction prevention layer 13 on (111) surface of the silicon (Si) substrate 11 exposed in a square shape of 300 μm ×300 μm. Molar fraction of Al and Ga in the n-AlGaN:Si layer 13 was approximately 3:7.

Next, TMG, $SiH_4$ and $NH_3$ were introduced to thereby form 500 nm in thickness of n-GaN:Si layer 411 on the reaction prevention layer 13 made of n-AlGaN:Si. Next, while the temperature of the n-type silicon (Si) substrate 11 was decreased to 500° C., TMA, TMG, $SiH_4$ and $NH_3$ were introduced to thereby form 20 nm in thickness of n-AlGaN:Si 421. Molar fraction of Al and Ga in the n-AlGaN:Si layer 421 was approximately 3:7. Next, while the temperature of the n-type silicon (Si) substrate 11 was raised to 1100° C., TMG, $SiH_4$ and $NH_3$ were introduced to thereby form 500 nm in thickness of n-GaN:Si 412. Again while the temperature of the n-type silicon (Si) substrate 11 was decreased to 500° C., TMA, TMG, $SiH_4$ and $NH_3$ were introduced to thereby form 20 nm in thickness of n-AlGa:Si 422. Molar fraction of Al and Ga in the n-AlGaN:Si layer 422 was approximately 3:7. In the process described above, about 1 μm in thickness of strain relaxation layer 14 was formed by laminating the 500 nm in thickness of n-GaN:Si layers 411 and 412 which were formed at high temperature of 1100° C. and 20 nm in thickness of n-AlGaN:Si layers 421 and 422 which were formed at low temperature of 500° C. alternately.

Next, while the temperature of the n-type silicon (Si) substrate 11 was raised to 1100° C., TMG, $SiH_4$ and $NH_3$ were introduced to thereby form 5 μm in thickness of n-GaN:Si layer 15 on the strain relaxation layer 14. After that the thus-obtained n-GaN:Si layer 15 was formed over the surface of the silicon (Si) substrate 11 which was exposed to be regions each having a square shape of 300 μm×300 μm and separated by the silicon oxide ($SiO_2$) film 12 formed in a pane shape. Even when a portion of the strain relaxation layer 14 and the n-GaN:Si layer 15 was formed on the edge of the silicon oxide ($SiO_2$) film 12, it was kept separated from a strain relaxation layer 14' and a n-GaN:Si layer 15' formed on the exposed 300 μm×300 μm square region of the silicon (Si) substrate 11. The temperature of thus-obtained n-GaN:Si layer 15 was cooled down to the ambient temperature at a rate of 20° C./min., but no cracks were generated.

[Sixth Embodiment]

By carrying out similar process to that of the fifth embodiment, the n-GaN:Si layer 15 comprising the strain relaxation layer 14 was deposited in the exposed 300 μm×300 μm square region of the silicon (Si) substrate 11, and group III nitride compound semiconductor was deposited thereon in sequence as follows to thereby obtain a light-emitting diode 300 shown in FIG. 9.

Silicon (Si) doped $Al_{0.08}Ga_{0.92}N$ n-clad layer 306, an emission layer 307, magnesium (Mg) doped $Al_{0.08}Ga_{0.92}N$ p-clad layer 308 and magnesium (Mg) doped GaN p-contact layer 309 were deposited in sequence on the n-GaN:Si layer 15. An electrode 310 made of gold (Au) was formed on the p-contact layer 309 and an electrode 311 made of aluminum (Al) was formed on the back surface of the silicon substrate 11. The thus-formed light-emitting diode (LED) 300 exhibited the remarkable improvement of device life time and light-emitting efficiency.

[Seventh Embodiment]

Figure 10:
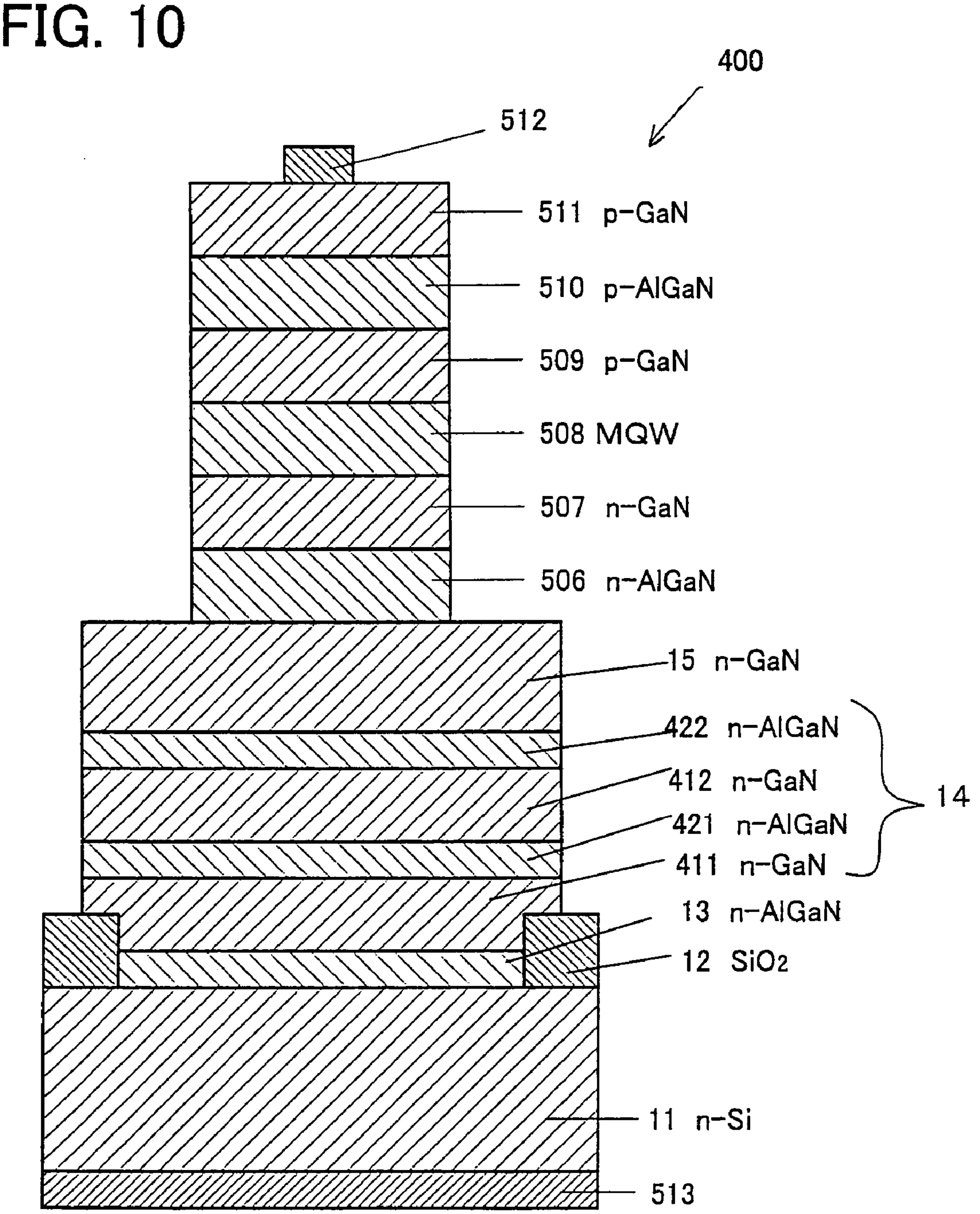
FIG. 10 is a cross sectional view showing the structure of a Group III nitride compound semiconductor light-emitting device according to a seventh embodiment of the present invention.
Figure 11:
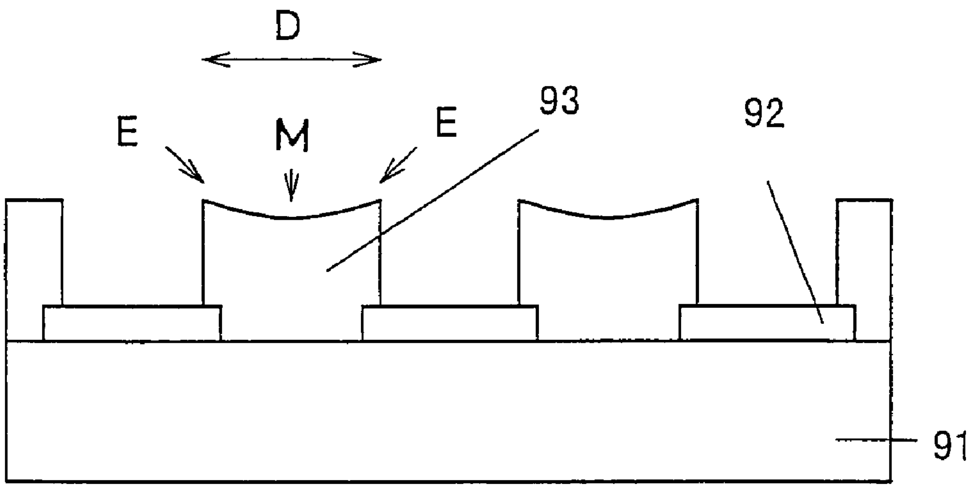
FIG. 11 is a cross sectional view showing epitaxial growth of a Group III nitride compound semiconductor according to the conventional selective growth.

By carrying out similar process to that of the fifth embodiment, the n-GaN:Si layer 15 comprising the strain relaxation layer 14 was deposited in the exposed 300 μm×300 μm square region of the silicon (Si) substrate 11, and group III nitride compound semiconductor was deposited thereon in sequence as follows to thereby obtain a light-emitting diode 400 shown in FIG. 10.

Silicon (Si) doped $Al_{0.08}Ga_{0.92}N$ n-clad layer 506, silicon (Si) doped GaN n-guide layer 507, an emission layer 508 having MQW structure, magnesium (Mg) doped GaN p-guide layer 509, magnesium (Mg) doped $Al_{0.15}Ga_{0.85}N$ p-clad layer 510 and magnesium (Mg) doped GaN p-contact layer 511 were deposited in sequence on the n-GaN:Si layer 15. An electrode 512 made of gold (Au) was formed on the p-contact layer 511 and an electrode 513 made of aluminum (Al) was formed on the back surface of the silicon substrate 11. The thus-formed light-emitting diode (LED) 400 exhibited the remarkable improvement of device life time and light-emitting efficiency.

While the present invention has been described with reference to the above embodiments, the present invention is not limited thereto, but may be modified as appropriate without departing from the spirit of the invention.

The invention claimed is:

1. A method for fabricating a Group III nitride compound semiconductor on a substrate through epitaxial growth, said method comprising:

forming a mask material, on which a group III nitride compound semiconductor does not epitaxially grow, in a grid pattern on a surface of said substrate;

zoning said substrate surface into each device formation region to be exposed;

forming a consumption region for a group III nitride compound semiconductor in which said substrate is exposed at each central portion of a band of said mask material formed in said grid pattern;

forming a first single crystal group III nitride compound semiconductor by epitaxial growth on each of the exposed and zoned substrate surface as said device formation region; and forming a second single crystal group III nitride compound semiconductor by epitaxial growth in said consumption region, wherein said consumption region is formed by exposing a portion of the surface of said substrate which is not used to form a device.

2. A method for fabricating a Group III nitride compound semiconductor according to claim 1, wherein said consumption region is formed by removing even a portion of said substrate and exposing said substrate surface having a step.

3. A method for fabricating a Group III nitride compound semiconductor according to claim 1, wherein an area of said device formation region is from 0.01 $mm^2$ to 1 $mm^2$.

4. A method for fabricating a Group III nitride compound semiconductor according to claim 1, wherein said substrate comprises silicon (Si).

5. A method for fabricating a Group III nitride compound semiconductor according to claim 1, further comprising:

forming a reaction prevention layer comprising a single crystal on the exposed zoned substrate surface as said device formation region so tat said substrate may not react with said Group III nitride compound semiconductor formed on said substrate during the process of fabricating a Group III nitride compound semiconductor.

6. A method for fabricating a Group III nitride compound semiconductor according to claim 5, wherein a thickness of said reaction prevention layer is from 100 nm to 1 mm.

7. A method for fabricating a Group III nitride compound semiconductor according to claim 1, wherein said reaction prevention layer comprises a group III nitride compound semiconductor whose aluminum (Al) composition of group III material has a molar fraction of 30% or more.

8. A method for fabricating a Group III nitride compound semiconductor according to claim 1, wherein said Group III nitride compound semiconductor is formed flat in the device forming region by forming said consumption region at said central portion of said band of the mask.

9. A method for fabricating a Group III nitride compound semiconductor, in which a Group III nitride compound semiconductor is fanned on a substrate through epitaxial growth, said method comprising:

forming a mask material, on which a Group III nitride compound semiconductor does not epitaxially grow, in a grid pattern on a surface of said substrate;

zoning said substrate surface into each region to be exposed;

forming a strain relaxation layer comprising Group III nitride compound semiconductors, which is formed at different ranges of temperature and has equivalent or different composition, deposited alternately on an upper portion of the surface of said substrate which is zoned with each other and is exposed; and forming a Group III nitride compound semiconductor on said strain relaxation layer, wherein said Group III nitride compound semiconductors deposited in an upper portion of said substrate surface are separated with each other, and wherein said process of fanning said strain relaxation layer comprises forming a non-single crystal Group III nitride compound semiconductor layer at a range of temperature from 200 ° C. to 600 ° C. and a single crystal group III nitride compound semiconductor layer at a range of temperature from 900 ° C. to 1200 ° C. at least two times.

10. A method for fabricating a Group III nitride compound semiconductor according to claim 9, wherein said Group III nitride compound semiconductor layer formed at the temperature from 200 ° C. to 600 ° C. has a thickness from 10 nm to 100 nm and said Group III nitride compound semiconductor layer fanned at the temperature from 900 ° C. to 1200 ° C. has a thickness from 200 nm to 1 mm.

11. A method for fabricating a Group III nitride compound semiconductor according to claim 9, wherein art area of said substrate surface which is zoned with each other and is exposed is from 0.01 $mm^2$ to 1 $mm^2$.

12. A method for fabricating a Group III nitride compound semiconductor according to claim 9, wherein an area of said substrate surface which is zoned with each other and is exposed is from 0.01 $mm^2$ to 0.3 $mm^2$ .

13. A method for fabricating a Group III nitride compound semiconductor according to claim 9, wherein said substrate comprises silicon (Si).

14. A method for fabricating a Group III nitride compound semiconductor according to claim 9, further comprising forming a reaction prevention layer mainly made of a single crystal on said substrate surface which is zoned with each other and is exposed in order to prevent said substrate from reacting with said Group III nitride compound semiconductor deposited thereon during production.

15. A method for fabricating a Group III nitride compound semiconductor according to claim 14, wherein said reaction prevention layer has a thickness from 100 nm to 1 mm.

16. A method for fabricating a Group III nitride compound semiconductor according to claim 9, wherein said reaction prevention layer comprises a Group III nitride compound semiconductor whose aluminum (A1) composition of Group III material has a molar fraction of 30% or more.

17. A method for fabricating a Group III nitride compound semiconductor according to claim 9, wherein said pair of Group III nitride compound semiconductor layers comprises a combination of a low-temperature buffer layer and a Group III nitride compound semiconductor layer.

* * * * *

UNITED STATES PATENT AND TRADEMARK OFFICE

CERTIFICATE OF CORRECTION

PATENT NO. : 7,163,876 B2
APPLICATION NO. : 10/473075
DATED : January 16, 2007
INVENTOR(S) : Nagai et al.

It is certified that error appears in the above-identified patent and that said Letters Patent is hereby corrected as shown below:

Title Page, Item (54) Title and Column 1, Lines 1-5, should read --METHOD FOR MANUFACTURING GROUP-III NITRIDE COMPOUND SEMICONDUCTORS, AND GROUP-III NITRIDE COMPOUND SEMICONDUCTOR DEVICES--

Signed and Sealed this

Third Day of April, 2007

JON W. DUDAS
*Director of the United States Patent and Trademark Office*

UNITED STATES PATENT AND TRADEMARK OFFICE

CERTIFICATE OF CORRECTION

PATENT NO. : 7,163,876 B2 Page 1 of 1
APPLICATION NO. : 10/473075
DATED : January 16, 2007
INVENTOR(S) : Seiji Nagai, Masayoshi Koike and Kazuyoshi Tomita It is certified that error appears in the above-identified patent and that said Letters Patent is hereby corrected as shown below:

Claim 9, Col. 18, line 46, delete “fanned”, and insert --formed--

Claim 9, Col. 18, line 64, delete “fanning”, and insert --forming--

Claim 10, Col. 19, line 9, delete “fanned”, and insert --formed--

Claim 11, Col. 19, line 12, delete “art”, and insert --an--

Claim 16, Col. 20, line 14, delete “(Al)”, and insert --(A1)--

Signed and Sealed this

First Day of May, 2007

JON W. DUDAS
*Director of the United States Patent and Trademark Office*